(12) United States Patent
Arai et al.

(10) Patent No.: US 6,547,902 B2
(45) Date of Patent: Apr. 15, 2003

(54) DIE BONDING METHOD AND APPARATUS

(75) Inventors: Tsuneharu Arai, Fussa (JP); Eiji Kikuchi, Musashimurayama (JP); Michio Yonemoto, Musashimurayama (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 211 days.

(21) Appl. No.: 09/738,727

(22) Filed: Dec. 15, 2000

(65) Prior Publication Data

US 2001/0004002 A1 Jun. 21, 2001

(30) Foreign Application Priority Data

Dec. 15, 1999 (JP) .............................. 11-356205

(51) Int. Cl.[7] .......................... B32B 31/00; B32B 35/00
(52) U.S. Cl. .................... 156/64; 156/249; 156/584; 156/344; 156/378; 438/458
(58) Field of Search .................... 156/344, 584, 156/64, 249, 378; 438/458

(56) References Cited

U.S. PATENT DOCUMENTS 3,894,633 A * 7/1975 Egan et al. ................. 156/584
5,098,501 A * 3/1992 Nishiguchi ................. 156/275.5
6,283,693 B1 * 9/2001 Acello et al. ................. 156/344

FOREIGN PATENT DOCUMENTS

| JP | 64-68938 | * 3/1989 | ................. 156/344 |
| JP | H9-64147 | 3/1997 | |
| JP | H9-64148 | 3/1997 | |

* cited by examiner

*Primary Examiner*—Mark A. Osele
(74) *Attorney, Agent, or Firm*—Koda & Androlia

(57) ABSTRACT

In die bonding in which good dies are bonded to good bonding portions of a bonding object (substrates, tapes, etc) and bad dies are bonded to bad bonding portions of the bonding object, dies on a wafer are successively detected and discriminated by a die detecting camera, dies are classified into good dies and bad dies on the basis of the results of this detection and discrimination, dies are registered on a wafer good/bad status map, and dies registered on the wafer good/bad status map are picked up by a die-transporting nozzle, transferred and bonded according to whether good dies or bad dies are requested based upon detection of bonding portions of the bonding object.

3 Claims, 4 Drawing Sheets

FIG. 2A
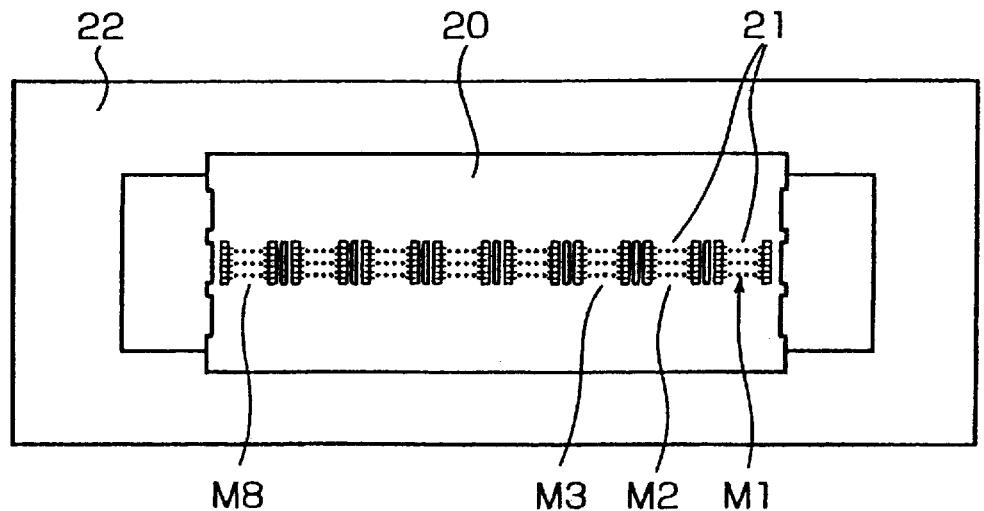
FIG. 2B
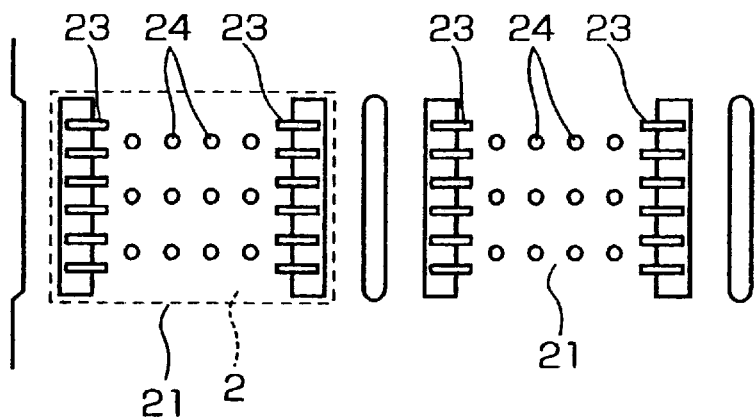
FIG. 3
| M | Good/bad status of bonding portions on tape |
|---|---|
| 1 | Good |
| 2 | Good |
| 3 | Bad |
| 4 | Good |
| — | — |
| — | — |
| — | — |
| 8 | — |

DIE BONDING METHOD AND APPARATUS

BACKGROUND OF THE INVENTION

1. Field of the Invention

The present invention relates to a die bonding method and apparatus.

2. Prior Art

When a plurality of dies are to be bonded to a substrate or tape (herein after collectively referred to as a "tape"), if the bonding portions of the tape have bad portions, bad dies are bonded to these bad bonding portions. The reason for this is as follows: if there are bonding portions to which dies are not bonded, a uniform flow of the molding in subsequent processes following bonding is not performed, so that strain is generated in the tape after molding; accordingly, good dies are bonded to good bonding portions on the tape, and bad dies are bonded to bad bonding portions on the tape.

In conventional die bonding methods, a judgement of good/bad of status of tape is made immediately before the tape that has been conveyed to a bonding position is subjected to the bonding operation. Meanwhile, a wafer and tray that accommodates bad dies are installed in a semiconductor chip supply section. Then, for good bonding portions on the tape, good dies on the wafer are picked up, transferred to the bonding position and bonded; while for bad bonding portions on the tape, bad dies are picked up from the tray, transferred to the bonding position and bonded. In other words, only good dies are picked up from the wafer and bonded. Bad dies on the wafer are not used; and instead, only bad dies in the tray are used and bonded.

In the above prior art, bad dies remaining on the wafer need to be removed manually and packed in the tray. Furthermore, an extra number of bad dies must be prepared in advance in the tray; and as a result, bad dies may sometimes be wasted.

BRIEF SUMMARY OF THE INVENTION

Accordingly, the object of the present invention is to provide a die bonding method and apparatus in which bad dies that are to be removed from a wafer and packed in a tray are eliminated or minimized, in which there is no need to pack an unnecessarily large number of bad dies in a tray, and in which bad dies are used without any waste.

The above object is accomplished by a unique steps of the present invention for a die bonding method in which good dies are bonded to good bonding portions on a substrate or tape (collectively called a "tape") and bad dies are bonded to bad bonding portions on this tape; and in the present invention, dies are classified into good dies and bad dies based upon the results of successive detection and discrimination of dies on a wafer by a detection means, the dies are registered on a wafer good/bad status map, and the dies registered on the wafer good/bad status map are picked up, transferred and bonded depending upon whether the dies required from the bonding portions on the tape are good or bad. In other words, dies registered on the wafer good/bad status map are picked up in response to a request for either good dies or bad dies depending upon the result of detection of the bonding portions on the tape, and then such dies are transferred and bonded to the bonding portions.

The above object is accomplished by another unique steps of the present invention for a die bonding method in which good dies are bonded to good bonding portions on a substrate or tape (collectively called a "tape") and bad dies are bonded to bad bonding portions on this tape; and in the present invention: a tray which accommodates bad dies is provided in addition to a wafer; dies are classified into good dies and bad dies on the basis of the results of successive detection and discrimination of dies on a wafer by a detection means; dies are registered on a wafer good/bad status map; the dies registered on the wafer good/bad status map are picked up, transferred and bonded depending upon whether the dies required from the bonding portions on the tape are good or bad; and in a case where there are no bad dies registered on the wafer good/bad status map, then bad dies inside the tray are picked up, transferred and bonded. In other words, dies registered on the wafer good/bad status map are picked up in response to a request for either good dies or bad dies depending upon the result of detection of the bonding portions of the tape, and then such picked-up dies are transferred and bonded to the bonding portions; however, in a case where there are no bad dies registered on the wafer good/bad status map, then bad dies inside the tray are picked up, transferred and then bonded to the bonding portions.

The above object is further accomplished by a unique structure for a die bonding apparatus in which good dies are bonded to good bonding portions on a substrate or tape (collectively called a "tape") and bad dies are bonded to bad bonding portions on this tape; and in the present invention the bonding apparatus includes:

a wafer ring holding device which positions and holds a wafer; a die transferring nozzle which picks up, holds and transfers dies from the wafer; a die detecting camera which detects the positions and good/bad status of the dies on the wafer; a tray which accommodates bad dies; a bad die chucking nozzle which picks up, holds and transfers bad dies from the tray; a tape conveying device which conveys the tape; a bonding device which bonds the dies to the bonding portions on the tape; and a bonding portion detecting camera which detects the good/bad status of the bonding portions on the tape; wherein when good dies are to be bonded to good bonding portions on the tape, good dies from the wafer are picked up, transferred and bonded to the good bonding portions; and when bad dies are to be bonded to bad bonding portions on the tape, bad dies from the wafer are picked up, transferred and bonded to the bad bonding portions in cases where bad dies that have been detected on the wafer and registered are available, and bad dies from the tray are picked up, transferred and bonded to the bad bonding portions in cases where no registered bad dies are available on the wafer.

BRIEF DESCRIPTION OF THE SEVERAL VIEWS OF THE DRAWINGS

FIG. 2A is a top view of one example of a tape, and FIG. 2B is an enlarged explanatory diagram of the bonding portions of the tape;

FIG. 3 shows the good/bad status map of the bonding portions of the tape;

DETAILED DESCRIPTION OF THE INVENTION

One embodiment of the present invention will be described with reference to FIGS. 1 and 5.

Figure 1:
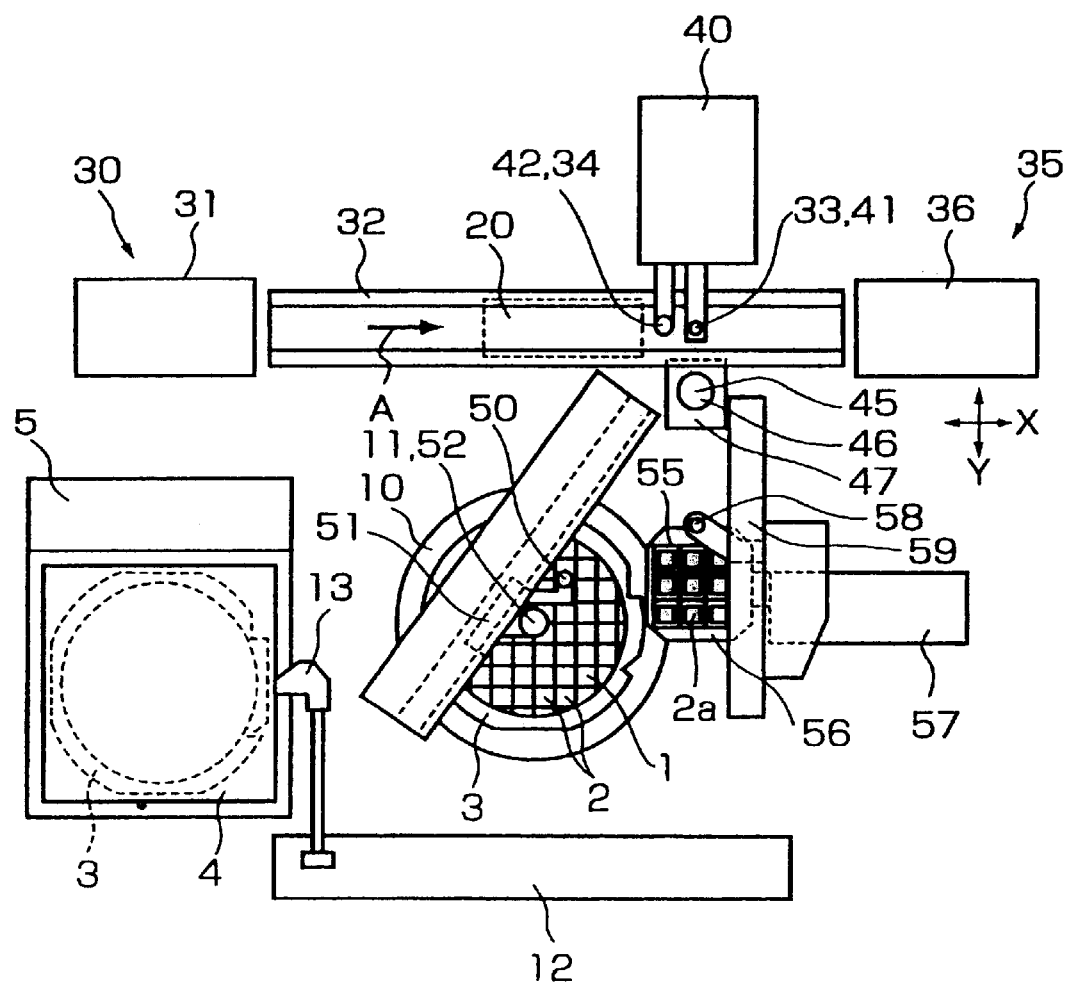
FIG. 1 is a top view of one embodiment of the die bonding apparatus according to the present invention.

As shown in FIG. 1, a wafer 1 which is pasted to a wafer sheet (not shown) is split longitudinally and laterally in the form of a lattice, and this wafer sheet is stretched so that individual dies 2 are formed. The outer circumferential part of the wafer sheet is attached to a wafer ring 3. A plurality of wafer rings 3 are accommodated in a wafer ring cassette 4 so that the wafer rings are stacked in a vertical direction with a fixed spacing between the individual wafer rings 3. The wafer ring cassette 4 is positioned and held by an elevator device 5.

A wafer ring holding device 10 is installed at a fixed distance from the wafer ring cassette 4 so that it faces the accommodation opening of the wafer ring cassette 4. A push-up needle (not shown) which pushes the dies 2 upward is disposed beneath the pick-up position 11 of the wafer ring holding device 10. Unused wafer rings 3 inside the wafer ring cassette 4 are chucked by the chucking part 13 of a wafer ring conveying means 12, and they are conveyed to the wafer ring holding device 10, where the wafer rings 3 are positioned and held by the wafer ring holding device 10. The wafer rings 3 for which pick-up has been completed by the wafer ring holding device 10 are chucked by the chucking part 13 of the wafer ring conveying means 12 and accommodated in their original positions in the wafer ring cassette 4.

The elevator device 5 which positions and holds the wafer ring cassette 4, as well as the wafer ring holding device 10 and wafer ring conveying means 12, are universally known as disclosed in, for example, Japanese Patent Application Laid-Open (Kokai) Nos. H9-64147 and H9-64148. In Japanese Patent Application Laid-Open (Kokai) No. H9-64147, guide rails (wafer ring holder) for guiding wafer rings are vertically movable and horizontally rotatable near the wafer ring cassette, and the guide rails are set to be horizontally at the same height when the wafer is carried. In Japanese Patent Application Laid-Open (Kokai) No. H9-64148, a sensor for detecting wafer rings is provided on either the upper or lower claw provided in the wafer ring conveying means.

In view of the above, further descriptions of the elevator device 5 which positions and holds the wafer ring cassette 4, the wafer ring holding device 10 and the wafer ring conveying means 12 components are omitted.

Substrates or tapes (collectively called "tape(s)" or bonding object) 20 are accommodated in the tape cassette 31 of a loading section 30. The tapes 20 that are fed out from the tape cassette 31 are conveyed by a tape conveying device 32. These tapes 20 pass through the bonding position 33 and are eventually accommodated in the tape cassette 36 of an unloading section 35. A bonding device 40 which bonds dies 2 to the tapes 20 is installed on one side of the bonding position 33. The bonding device 40 is equipped with a bonding tool 41, which bonds the leads of the tapes 20 to the dies 2, and a bonding portion detecting camera 42, which detects the position and good/bad status of the bonding portions of the tapes 20. The bonding portion detecting camera 42 is installed so that it is separated form the bonding tool 41 by one pitch (in the direction of length) of the bonding portions 21 on the tape 20 shown in FIG. 2. Accordingly, a position that is located one pitch before the bonding position 33 is the good/bad status detection position 34 for the bonding portions 21 on the tape 20. The loading section 30, tape conveying device 32, unloading section 35 and bonding device 40 have known structures. Accordingly, a further description of these elements is omitted.

A bonding stage 46 is installed in a die receiving position 45 located beneath the bonding position 33 and on the opposite side of the bonding position 33 from the bonding device 40. This bonding stage 46 is arranged so that it holds the dies 2 by vacuum suction. The bonding stage 46 is mounted on an XY table 47 which is driven in the X and Y directions so that the bonding stage 46 is driven in a reciprocating motion between the die receiving position 45 and bonding position 33. The bonding stage 46 is also movable upward and downward.

A die-transporting nozzle 50 that vacuum-chucks the dies 2 is installed above the wafer ring holding device 10. The die-transporting nozzle 50 is driven in a reciprocating motion between the pick-up position 11 and die receiving position 45 by a die-transporting device 51. The die-transporting nozzle 50 is further movable upward and downward. In addition, a die detecting camera 52 which detects the good/bad status of the dies 2 is installed above the pick-up position 11. The die detecting camera 52 is fastened to a fixed part of the die-transporting device 51. The die detecting camera 52 is installed so that it is positioned above the die-transporting nozzle 50. Thus, the die detecting camera 52 is prevented from interfering with the die-transporting nozzle 50 when the die-transporting nozzle 50 is positioned above the pick-up position 11.

A tray holder 56 which positions and carries a tray 55 that accommodates bad dies 2a is installed so as to face the bonding stage 46 in the Y direction that passes through the bonding position 33 at right angles to the direction (hereafter referred to as the "X direction") that is parallel to the feeding direction A of the tapes 20. This tray holder 56 is driven in the X direction by a driving means 57. A bad die chucking nozzle 58 which holds bad dies 2a by vacuum suction is installed so as to face the bonding stage 46 in the Y direction that passes through the bonding position 33. The bad die chucking nozzle 58 is driven by a bad die chucking nozzle transporting device 59 so that it performs a reciprocating motion between the tray 55 and the bonding stage 46. The bad die chucking nozzle 58 is movable upward and downward.

FIG. 2 shows one of the tapes 20. The tape 20 is fastened to a carrier 22. Leads 23 and bumps 24 are formed on each tape 20.

FIG. 3 shows a good/bad status map for the tape 20. M indicates bonding numbers according to which the bonding portions 21 of the tape 20 are successively stored in memory. In the example shown in FIG. 2, the tape 20 has eight bonding portions 21; accordingly, M=1, 2, 3, . . . 8. In other words, the eight bonding portions 21 are stored in a memory which stores the bonding numbers M. The good/bad status of the bonding portions 21 is stored in memory after being detected by the bonding portion detecting camera 42 shown in FIG. 1. In the description below, M=1 is a good bonding portion, M=2 is a good bonding portion, M=3 is a bad bonding portion, M=4 is a good bonding portion, and M=5 is a bad bonding portion.

Figure 4:
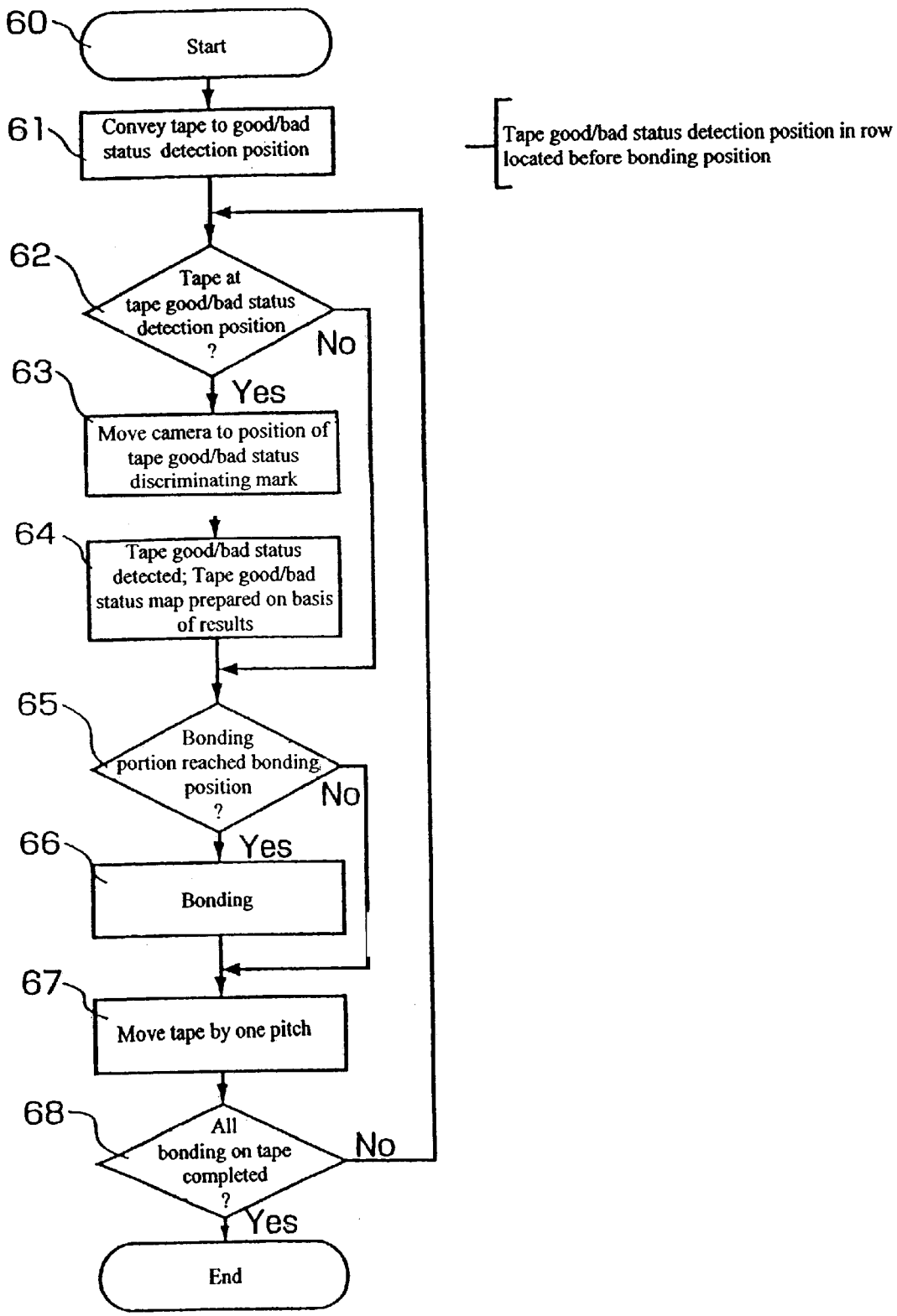
FIG. 4 is a flow chart of the tape good/bad status map preparation process and the tape conveying process.

First, the preparation of the good/bad status map for the bonding portions 21 on the tape 20 and the movement of the tape 20 will be described with reference to FIG. 4 along with FIGS. 1 through 3.

When bonding is initiated (step 60), a tape 20 in the tap cassette 31 of the loading section 30 is fed out onto the tape conveying device 32, and this tape 20 is conveyed (step 61) by the tape conveying device 32 so that the first bonding portion 21 of the tape 20 is moved to the good/bad status detection position 34.

A check is made there in order to ascertain whether or not there is a tape 20 in the good/bad status detection position 34

(step 62), and the bonding portion detecting camera 42 is moved to the position of a tape good/bad status discriminating mark formed on the tape 20 (step 63). Then, the good/bad status of the first bonding portion 21 is detected. As a result, a "good" bonding portion is stored at M=1 in the map shown in FIG. 3, and a good/bad status map is formed (step 64).

Next, a check is made in order to ascertain whether or not the bonding portion 21 has reached the bonding position (step 65). In the case shown in FIG. 3, the bonding portion 21 has not reached the bonding position. Accordingly, there is no tape 20 in the bonding position 33, and tape conveying is performed by one pitch (step 67).

Next, a check is made in order to ascertain whether or not bonding has been completed for all of the bonding portions 21 of the tape 20 (step 68). Since bonding has not been completed in this case, the process returns to step 62.

Next, the steps 62 and 63 are performed by the same operation as that described above; and the fact that the bonding portion 21 designated as M=2 is a good bonding portion is stored in memory, and the good/bad status map is further formed (step 64).

Then, a check is made in order to ascertain whether or not a bonding portion 21 has reached the bonding position 33 (step 65). Since the bonding portion 21 designated as M=1 is now positioned in the bonding position 33, the bonding to the bonding portion 21 designated as M=1 is performed (step 66) by the method described below.

When bonding (step 66) is completed, the process returns to the step 62 via the steps 67 and 68 by the same operation as that described above.

Next, the processes 62 and 63 are performed, and the fact that M=3 is a bad bonding portion is stored in memory, and the good/bad status map is further formed (step 64).

Meanwhile, one of the wafer rings 3 inside the wafer ring cassette 4 is conveyed by the wafer ring conveying means 12, and the wafer ring 3 is positioned and held by the wafer ring holding device 10.

Then, the judgment of the good/bad status of the dies 2 of the wafer 1 is performed for dies 2 within a predetermined detection range during a waiting period in which the operation of pushing the dies 2 upward and picking the dies 2 up from the wafer ring holding device 10 are not being performed. In this operation, the wafer ring holding device 10 is moved one die pitch interval at a time in the X and Y directions, so that a die 2 whose good/bad status has not yet been judged is positioned in the die good/bad status judgment position, and the good/bad status of this die 2 is detected by the die detecting camera 52. The coordinates of the die 2 and the judgment results obtained for the die 2 are successively stored in the wafer good/bad status map. This good/bad status judgment process for the dies 2 stops before the operation in which the dies 2 are picked up from the wafer ring holding device 10 is initiated.

Thereafter, the wafer ring holding device 10 is moved in the X and Y directions, so that the next die 2 that is to be picked up is positioned in the pick-up position 11.

When the judgment of the good/bad status of the die 2 is to be initiated next, a die 2 whose good/bad status has not yet been judged among the dies 2 stored in the wafer good/bad status map is positioned in the die good/bad status judgment position, and the good/bad status of the die is judged.

Figure 5:
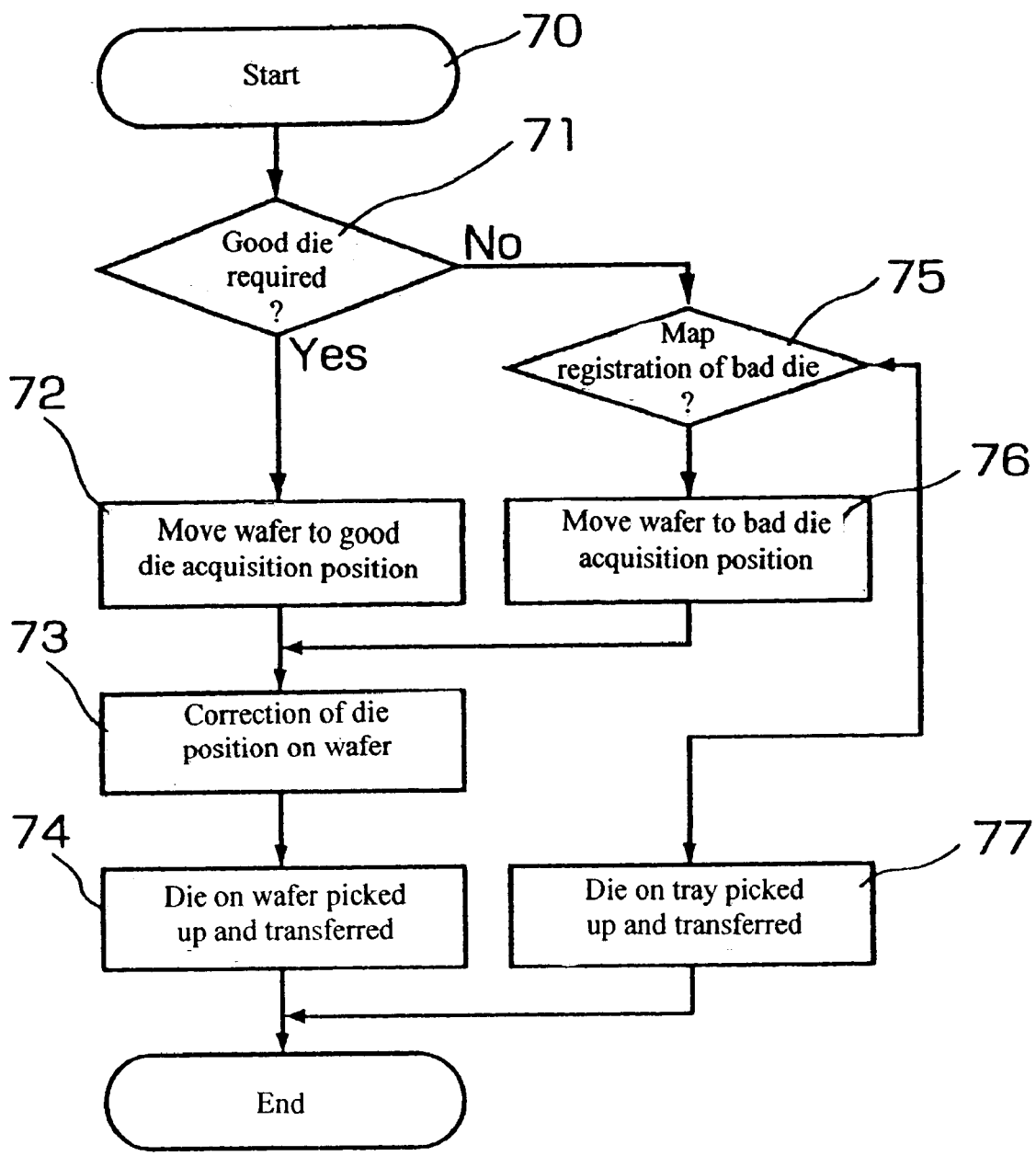
FIG. 5 is a flow chart of the search for required dies.

Accordingly, when dies 2 are requested in accordance with the good/bad status map of the bonding portions 21 of the tape 20 shown in FIG. 3, the request is processed according to the steps shown in FIG. 5.

When a request for a die 2 is initiated (step 70) from the bonding device 40, a good die or bad die is selected according to whether there is a request for a good die or not (step 71). As described above, since M=1 shown in FIG. 2 is a good bonding portion 21, the wafer 1 is moved (step 72) so that a good die whose coordinates are stored in memory as the coordinates of a good die is moved to the pick-up position 11, and correction of the die position is performed (step 73). Then, the die 2 is picked up and transferred (step 74) by the method described below.

The pick-up and transfer of the die 2 are performed in a state in which the die 2 that is to be picked up has been moved into the pick-up position 11. More specifically, the die-transporting nozzle 50 is moved to a point above the pick-up position 11 and then lowered, and the push-up needle (not shown) disposed beneath the pick-up position 11 is raised. As a result, the die 2 is pushed upward, and the die-transporting nozzle 50 holds this die 2 by vacuum suction. The die-transporting nozzle 50 is then raised and moved to a point above the bonding stage 46 by the die-transporting device 51. The die-transporting nozzle 50 is next lowered, and the vacuum is cut off so that the die 2 is placed on the bonding stage 46. Afterward, the die-transporting nozzle 50 is raised and is caused to return to its original position by the die-transporting device 51.

The bonding operation is performed, as follows, in the same operation regardless of whether the die is a good die or a bad die. When the die is placed on the bonding stage 46, the bonding stage 46 is moved to a point beneath the bonding portion 21 of the tape 20 that is positioned in the bonding position 33. Next, the bonding tool 41 of the bonding device 40 is moved to a point above this bonding portion 21 and then lowered, and the bonding stage 46 is raised, so that the die 2 is bonded to the bonding portion 21.

More specifically, since the bonding portions 21 designated as M=1 and M=2 are good bonding portions, good dies that are picked up from the wafer 1 and placed on the bonding stage 46 are bonded to these good bonding portions.

On the other hand, the bonding portion 21 designated as M=3 is a bad bonding portion. Accordingly, the die that is required according to the request for a good (step 71) is a bad die. Thus, when a bad die is stored in the wafer good/bad status map when the map registration of a bad die is queried (step 75), the wafer ring holding device 10 is moved in the X and Y directions (step 76) so that the coordinates of the bad die stored in the wafer good/bad status map are positioned at the pick-up position 11. Then, as in the case of the good die, and die position on the wafer is corrected (step 73), and the bad die is picked up and transferred (step 84).

When, however, there is no bad die stored in the wafer good/bad status map when the map registration of a bad die is queried (step 75), a bad die 2a on the tray 55 is picked up and transferred (step 77).

This pick-up and transfer action of the bad die 2a are accomplished by moving the bad die 2a inside the tray 55 to the chucking position. More specifically, the tray 55 is driven in the X direction by the driving means 57, and the bad die 2a is moved to the chucking position. Then, the bad die chucking nozzle 58 is driven by the bad die chucking nozzle transporting device 59, and the nozzle 58 is positioned above the bad die 2a that is to be picked up. Then, the bad die chucking nozzle 58 is lowered so as to contact the bad die 2a; and at more or less the same time, the vacuum is switched on, so that the bad die chucking nozzle 58 vacuum-chucks the bad die 2a. The bad die chucking nozzle 58 is moved by the bad die chucking nozzle transporting device 59, and the bad die chucking nozzle 58 is moved to a point above the bonding stage 46 positioned in the die receiving position 45. The bad die chucking nozzle 58 is next lowered, the vacuum is cut off, and the bad die 2a is placed on the bonding stage 46. Afterward, the bad die chucking nozzle 58 is raised and returned to its original position by the bad die chucking nozzle transporting device 59. When the bad die 2a is placed on the bonding stage 46, the bad die 2a is subsequently bonded to the bad bonding portion 21 of the tape 2 in the same manner as described above.

Here, when no pick-up operation of a bad die 2a from the tray 55 or a die 2 from the wafer 1 is being performed, detection of the good/bad status of the dies 2 on the wafer 1 can be performed. In other words, a die 2 whose good/bad status has not yet been judged among the dies 2 that have not yet been stored in the wafer good/bad status map is positioned in the die good/bad status judgment position, the good/bad status of this die is judged, and the coordinates of the die 2 and judgment results obtained for the die 2 are stored in order in the wafer good/bad status map.

As seen from the above, in cases where a good die is to be bonded to a good bonding portion 21 on the tape 20, a good die from the wafer 1 is picked up, transferred and bonded. In cases where a bad die is to be bonded to a bad bonding portion 21 on the tape 20, either one of the two processes are performed: if a bad die that has been detected on the wafer 1 and registered is available, this bad die is preferentially picked up, transferred and bonded; if no registered bad die is available on the wafer, a bad die is picked up from the tray 55, transferred and then bonded. Accordingly, bad dies removed from the wafer and packed in a tray can be eliminated or minimized. Also, the need to pack an unnecessarily large number of bad dies in the tray as well can be eliminated. Thus, bad dies can be used without waste.

In cases where the number of bad dies detected on the wafer is large, and there is a waiting time for the pick-up and transfer of dies from the wafer 1, then an empty tray (55) can be provided beforehand in addition to the (main) tray 55 so as to accommodate bad dies from the wafer 1 in the empty tray (55) during the waiting time. In other words, during the waiting time, the die-transporting nozzle 50 vacuum-chucks bad dies from the wafer 1 and places them on the bonding stage 46, and the bad die chucking nozzle 58 vacuum-chucks the bad dies placed on the bonding stage 46 and puts them in the empty tray 55.

In the above embodiment, the bonding portions 21 are formed in a single row on the tape 20. However, the present invention can be applied to tapes on which the bonding portions are formed in two or more rows. Furthermore, the above embodiment is described with reference to a tape. However, it goes without saying that the present invention is applicable to substrates.

Furthermore, in the above description, the bonding portion detecting camera 42 is installed at a distance from the bonding tool 41 by one pitch (in the direction of length) of the bonding portions 21 on the tape 20 shown in FIG. 2. However, there are no particular restrictions on this spacing. In an actual apparatus, the bonding portion detecting camera is provided with a distance of two or greater pitches away from the bonding tool. Accordingly, in this case, a position that is located before the bonding position, and that is separated from the bonding position by two pitches or greater, is the good/bad status detection position. With this setting, the request for dies from the bonding device can be speeded up by judging the good/bad status of the tape or substrate at a position located two pitches or more in advance, and the loss time can be reduced.

As seen from the above, in the present invention that is for a die bonding method and apparatus in which good dies are bonded to good bonding portions of a bonding object (tape, substrate, etc.) and bad dies are bonded to bad bonding portions of the bonding object, the dies are classified into good dies and bad dies on the basis of the results of successive detection and discrimination of the dies on the wafer by a detection means, the dies are registered on a wafer good/bad status map, and the dies registered on the wafer good/bad status map are picked up, transferred and bonded according to the judgment on good dies or bad dies derived from the detection of the bonding portions of the bonding object. Accordingly, bad dies that are removed from the wafer and packed in a tray can be eliminated or minimized, the need to store an unnecessarily large number of bad dies beforehand in the tray is eliminated, and bad dies can be used without any waste.

What is claimed is:

1. A die bonding mod in which good dies are bonded to good bonding portions on a bonding object and bad dies are bonded to bad bonding portions on said bonding object, said method comprising the steps of:

successively detecting dies on a wafer by a detection means, classifying said dies into good dies and bad dies based upon results of said successive detection, registering said dies on a wafer good/bad status map, and picking up, transferring and bonding said dies to said bonding portions in response to a request for either good dies or bad dies depending upon a result of detection of said bonding portions.

2. A die bonding apparatus in which good dies are bonded to good bonding portions on a bonding object and bad dies are bonded to bad bonding portions on said bonding object, wherein dies are classified into good dies and bad dies based upon results of successive detection and discrimination of said dies on a wafer by a detection means, said dies are registered on a wafer good/bad status map, and said dies registered on said wafer good/bad status map are picked up, transferred and bonded to said bonding portions in response to a request for either good dies or bad dies depending upon a result of detection of said bonding portions.

3. A die bonding apparatus in which good dies are bonded to good bonding portions on a bonding object and bad dies are bonded to bad bonding portions on said bonding object, said bonding apparatus comprising:

a wafer ring holding device which positions and holds a wafer;

a die transferring nozzle which picks up, holds and transfers dies from said wafer;

a die detecting camera which detects positions and good/bad status of said dies on said wafer;

a tray which accommodates bad dies;

a bad die chucking nozzle which picks up, holds and transfers bad dies from said tray;

a bonding object conveying device which conveys said bonding object;

a bonding device which bonds dies to said bonding portions of said bonding object; and a bonding portion detecting camera which detects a good/bad status of said bonding portions of said bonding object; wherein when good dies are to be bonded to good bonding portions on said bonding object, good dies from said wafer are picked up, transferred and bonded to said good bonding portions; and when bad dies are to be bonded to bad bonding portions on said bonding object, bad dies from said wafer are picked up, transferred and bonded to said bad bonding portions in cases where bad dies that have been detected on said wafer and registered are available, and bad dies from said tray are picked up, transferred and bonded to said bad bonding portions in cases where no registered bad dies are available on said wafer.

* * * * *